United States Patent [19]

Pellegrini et al.

[11] Patent Number: 4,533,933
[45] Date of Patent: Aug. 6, 1985

[54] SCHOTTKY BARRIER INFRARED DETECTOR AND PROCESS

[75] Inventors: Paul W. Pellegrini, Bedford; Charlotte E. Ludington, Sherborn; Aleksandar Golubovic, Brookline; Melanie M. Weeks, Fitchburg, all of Mass.

[73] Assignee: The United States of America as represented by the Secretary of the Air Force, Washington, D.C.

[21] Appl. No.: 447,599

[22] Filed: Dec. 7, 1982

[51] Int. Cl.³ .......................................... H01L 29/48
[52] U.S. Cl. ................................... 357/15; 136/255; 357/30; 357/61
[58] Field of Search ................ 357/15, 61, 30, 71 S, 357/67 S; 136/255

[56] References Cited

U.S. PATENT DOCUMENTS

| | | | |
|---|---|---|---|
| 3,449,644 | 6/1969 | Nassibian | 357/61 |
| 3,902,066 | 8/1975 | Rossild et al. | 250/332 |
| 4,000,502 | 12/1976 | Butler et al. | 357/15 |
| 4,027,319 | 5/1977 | Borrello et al. | 357/15 |
| 4,261,095 | 4/1981 | Dreves et al. | 357/15 |
| 4,273,596 | 6/1981 | Gutierrez et al. | 148/171 |
| 4,312,114 | 1/1982 | Schoolar | 29/257 |
| 4,319,258 | 3/1982 | Harnagel et al. | 357/15 |
| 4,373,166 | 2/1983 | Bergeron et al. | 357/15 |
| 4,394,673 | 7/1983 | Thompson et al. | 357/15 |

Primary Examiner—James W. Davie
Assistant Examiner—Georgia Y. Epps
Attorney, Agent, or Firm—Donald J. Singer; Richard J. Donahue

[57] ABSTRACT

A Schottky barrier diode formed of iridium-silicon material having a frequency response encompassing the 3.0 to 5.0 micrometer infrared band. The bandwidth, uniformity of response and silicon base material of such diodes renders them ideally suited for use in large scale focal plane arrays associated with infrared cameras.

5 Claims, 4 Drawing Figures

SCHOTTKY BARRIER INFRARED DETECTOR AND PROCESS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to solid state radiation detectors, and more particularly, to an improved Schottky barrier photovoltaic detector and a process for manufacturing it.

Schottky or surface barrier devices are basically a junction diode in which the junction is formed between a semiconductor material and a metal contact, rather than between dissimilar semiconductor materials. During the past few years, the technology for fabricating Schottky barrier devices has advanced at a rapid pace to the point where they are now used as elemental detection cells in large scale focal plane arrays. The individual Schottky barrier cells are generally formed at the junctions of platinum with a silicon base material.

The use of silicon-based material is a particularly desirable way to facilitate the manufacture of infrared focal plane detectors. In essence, the diodes are fabricated in high quality silicon wafers and are used to both create and store the optical signal. Attached to each detector is a charge coupled device (CCD) gate. The CCD gate provides a means for extracting signals from its associated detector and for conducting that signal from the semiconductor wafer to an associated video display device.

A major benefit derived from the use of silicon substrate material is the wealth of technological data available for constructing the aforementioned charge coupled diode units as well as the clock generators, drivers etc. necessary for sensing and processing the optical information stored in the Schottky barrier diodes. Another advantage is the cell-to-cell uniformity of Schottky cells formed of silicon material, such as has been heretofore observed in platinum-silicon cells.

The major objection to using silicon-based material for infrared imaging is that the elemental detectors do not have the sensitivity of detectors formed from other binary or ternary materials. For example, in the important 3.0 to 5.0 micrometer band, elemental detectors of ternary materials such as mercury cadmium telluride have theoretical sensitivities which are a factor of 10 times better than the best platinum-silicon detectors. Another disadvantage of platinum-silicon Schottky barrier diodes is their limited sensitivity at the high end of the aforementioned infrared band.

SUMMARY OF THE INVENTION

In accordance with the present invention it has been found that silicon-based Schottky barrier photodiodes having improved sensitivity and long wavelength response can be formed using iridium as the associated metallic element.

It is therefore, the primary object of the present invention to provide an improved silicon-based Schottky barrier photodiode.

It is another object of the present invention to provide an silicon-based Schottky barrier diode having improved bandwidth of response in the infrared spectrum.

It is a further object of the present invention to provide a process for manufacturing an improved Schottky barrier diode that will achieve the aforementioned objects.

These and other objects, advantages and features of this invention will become apparent upon consideration of the following detailed description thereof when taken in conjunction with the accompanying drawings.

DETAILED DESCRIPTION OF THE INVENTION

Figure 1:
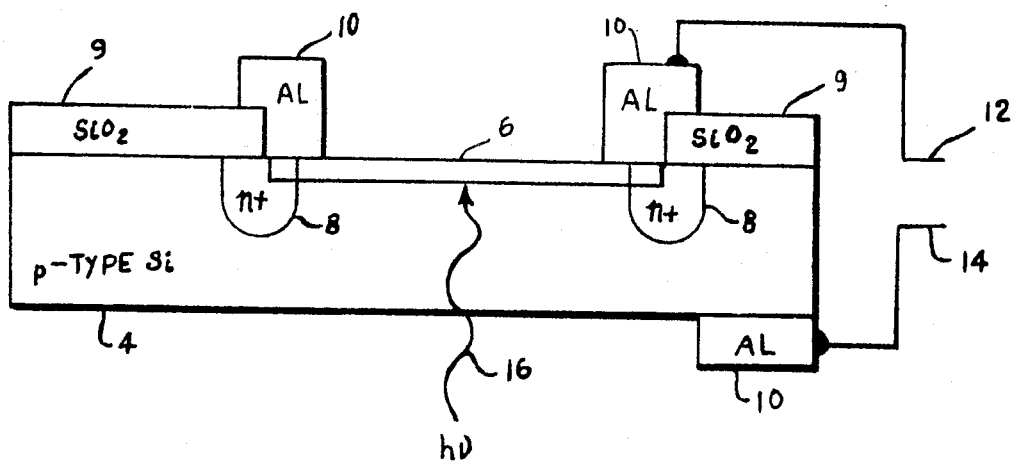
FIG. 1 is a vertical cross-sectional view of a Schottky barrier diode constructed in accordance with the present invention.

Referring now to FIG. 1 of the drawings there is shown a detector constructed in accordance with the present invention. The detector is formed on a p-type silicon wafer substrate 4 of the quality suitable for creating integrated circuits. The surface of substrate 4 is initially cleaned of all oxides and heavy metals by using HF, $H_2O_2$ and $NH_4F$ solvents. When the surface is properly cleaned the substrate 4 is placed in an evaporation chamber. An iridium layer 6 is now evaporated onto the surface of substrate 4 from a high purity metallic source in an electronic beam evaporation machine. Electron beam evaporation is utilized because the refractory nature of iridium does not allow other more conventional, lower temperature methods of evaporation to be used. Evaporation is done at $10^{-8}$ Torr onto the properly cleaned silicon wafer having impurity concentrations of $10^{15}$ cm$^{-3}$ boron. Silicon wafers having impurity concentrations of up to $10^{16}$ cm$^{-3}$ can be used, depending upon the specific applications.

Once the iridium layer has been deposited, it must be annealed into the silicon via a solid state diffusion process. The annealing temperature can be any value from 300° C. to 700° C. It has been observed, however, that best results occur with an annealing temperature of 450° C. to 550° C. The function of the annealing operation is to form a layer of iridium silicide (IrSi) on the silicon substrate. During the annealing operation, any impurities at the IrSi interface are taken up into the IrSi lattice and an atomically clean interface exists between the two materials. Atomic cleanliness is important because impurities such as oxides or carbon at the interface can act as an insulator between the iridium and silicon and will cause the barrier height to vary and the stability of the entire detector to be adversely affected.

Guard rings 8 of n-type material, such as arsenic are implanted at the extremeties of the diode active imaging area. This region acts as a block to any surface currents which might occur and it also eliminates edge effects caused by the manufacture of the sintered IrSi layer. These two phenonena are extremely detrimental to the operation of the detector under reverse bias conditions because they are the major source of leakage current. Elimination of reverse leakage allows the device to be operated at a reverse bias of 10 or more volts. A silicon dioxide protective layer 9 may be formed from the guard rings 8 to the edges of the silicon substrate 4. Aluminum contacts 10 are then made to both the substrate 4 and the iridium layer 6 and electrodes 12 and 14 are bonded to the top and bottom aluminum contacts 10 to complete the Schottky barrier device.

The preferred mode of operation, as shown in FIG. 1, is to illuminate the barrier from the backside by sending photons 16 through the bulk silicon material. The infrared photons are transparent to the silicon but are strongly absorbed in the IrSi layer 6. The absorption process creates hole-electron pairs in the IrSi layer very close to the metal semiconductor interface.

Front side illumination, while feasible, has two specific drawbacks. First, if the IrSi layer is thick, then none of the optically-generated holes will be able to get to the IrSi-Si interface and be collected there as signal. Secondly, there is no interposed silicon material to act as a filter which cuts off wavelengths longer than 1.1 micrometers. Therefore, short wavelength photons may impinge upon the IrSi-Si interface resulting in extreme non-uniformities in the photo detection.

Figure 2:
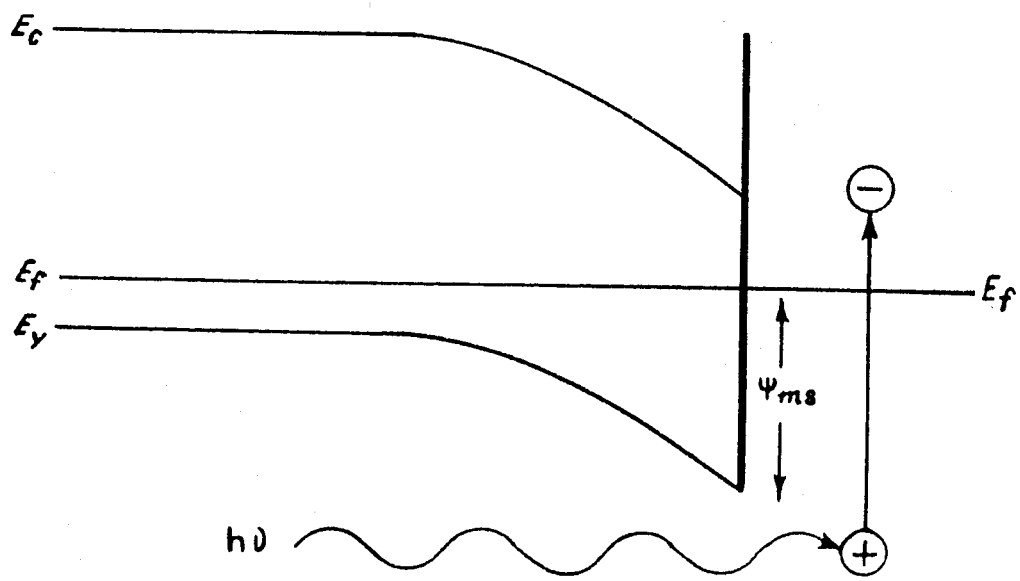
FIG. 2 is a graph depicting the electronic band structure of the Schottky barrier diode of the present invention.

FIG. 2 is a graph which shows the band structure of the barrier and illustrates how the IrSi on p-type silicon works. $E_c$ and $E_v$ are the conduction and valance band edges, respectively. Conduction of holes across the barrier occurs by thermionic emission of carriers across the barrier whose height is $\psi_{ms}$. The photon crosses the barrier and is absorbed by the metal. The absorption process creates a hole-electron pair. If the photon has more energy than the barrier, it excites the electron into a state which is higher than the Fermi level, $E_f$. An electron scattered to this state will leave the hole free to be scattered and communicate with the semiconductor. If the hole is scattered in the proper direction, it can cross the barrier and end up in the semiconductor depletion region. Once that occurs, it is quickly swept out under the influence of the high field in the p-type depletion area. Such holes are then available to be measured as optical signal by external measuring means.

Infrared detecting diodes have been fabricated on p-type substrates using the process described above and the barrier height has been measured using photo electric techniques. The photoelectric measurement method involves shining monochromatic light on the barrier and creating photocurrents in the IrSi film. These photocurrents are generated when the individual photons are absorbed and create a hole-electron pair. If the holes have enough energy to surmount the barrier, and if they have the proper momentum vector, they have a high probablity of penetrating the barrier and being collected as photocurrents. The mechanism by which this occurs is thermionic emission of majority carriers. This mechanism is different from the minority carrier current which occurs in normal p-n junction diodes. The phenomenon of barrier emission is best described by the Fowler relationship equation:

$$Y = C_1 (E - \psi_{ms})^2 / E$$

where:
Y = yield percentage in electrons per photon
$C_1$ = proportionality constant in % per eV
E = energy of the incident photons
$\psi_{ms}$ = barrier height of IrSi-Si interface This equation can be linearized with respect to the barrier height $\psi_{ms}$ by multiplying both sides of the equation by E and then taking the square root of both sides as shown below:

$$E \times Y = C_1 (E - \psi_{ms})^2$$

$$\sqrt{E \times Y} = \sqrt{C_1} (E - \psi_{ms})$$

Figure 3:
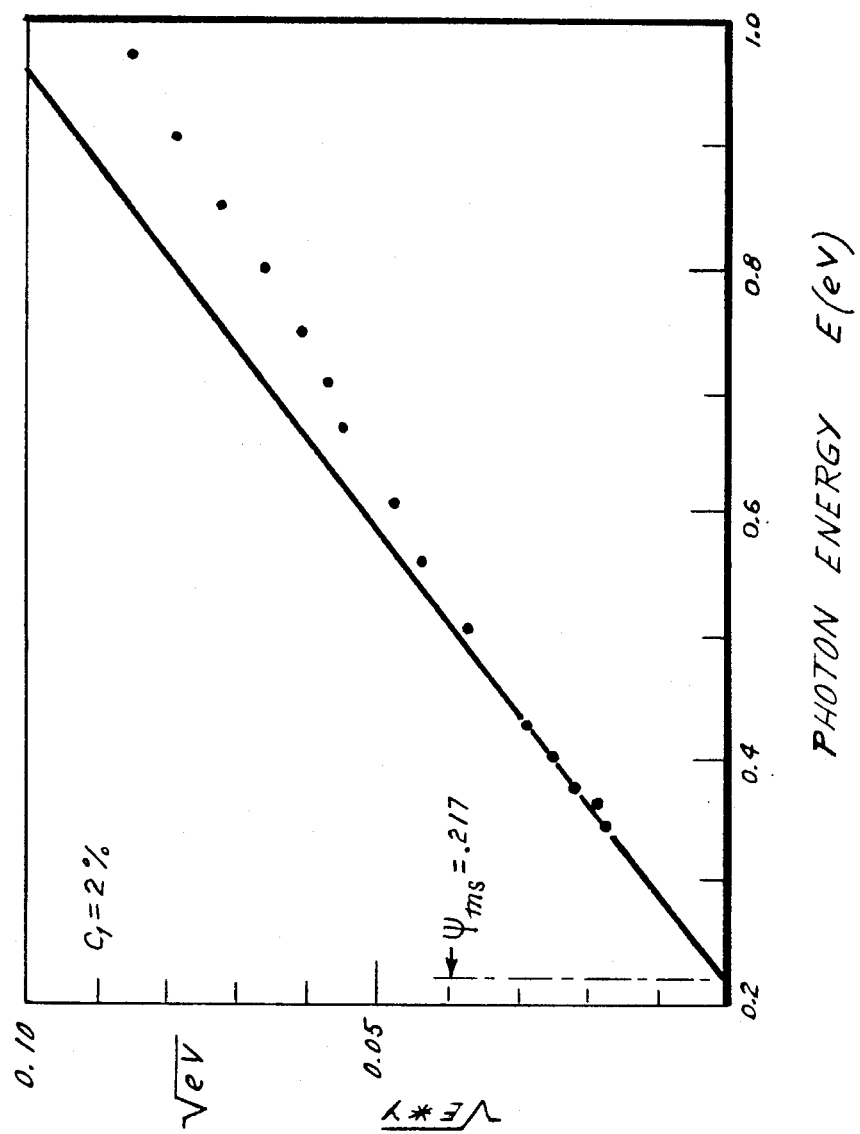
FIG. 3 is a graph illustrating the photo response of the present invention.

FIG. 3 is a plot of the photon energy of a typical IrSi Schottky photodiode. When $\sqrt{E*Y}$ is plotted versus photon energy, E, a straight line is obtained. The intercept of this line on the energy axis is the barrier height, $\psi_{ms}$. The slope of the line is related to $C_1$ whose units are given in percent per eV. The barrier height $\psi_{ms}$ equals 217 mV, which is equivalent to a long wavelength cutoff of 5.7 micrometers.

Figure 4:
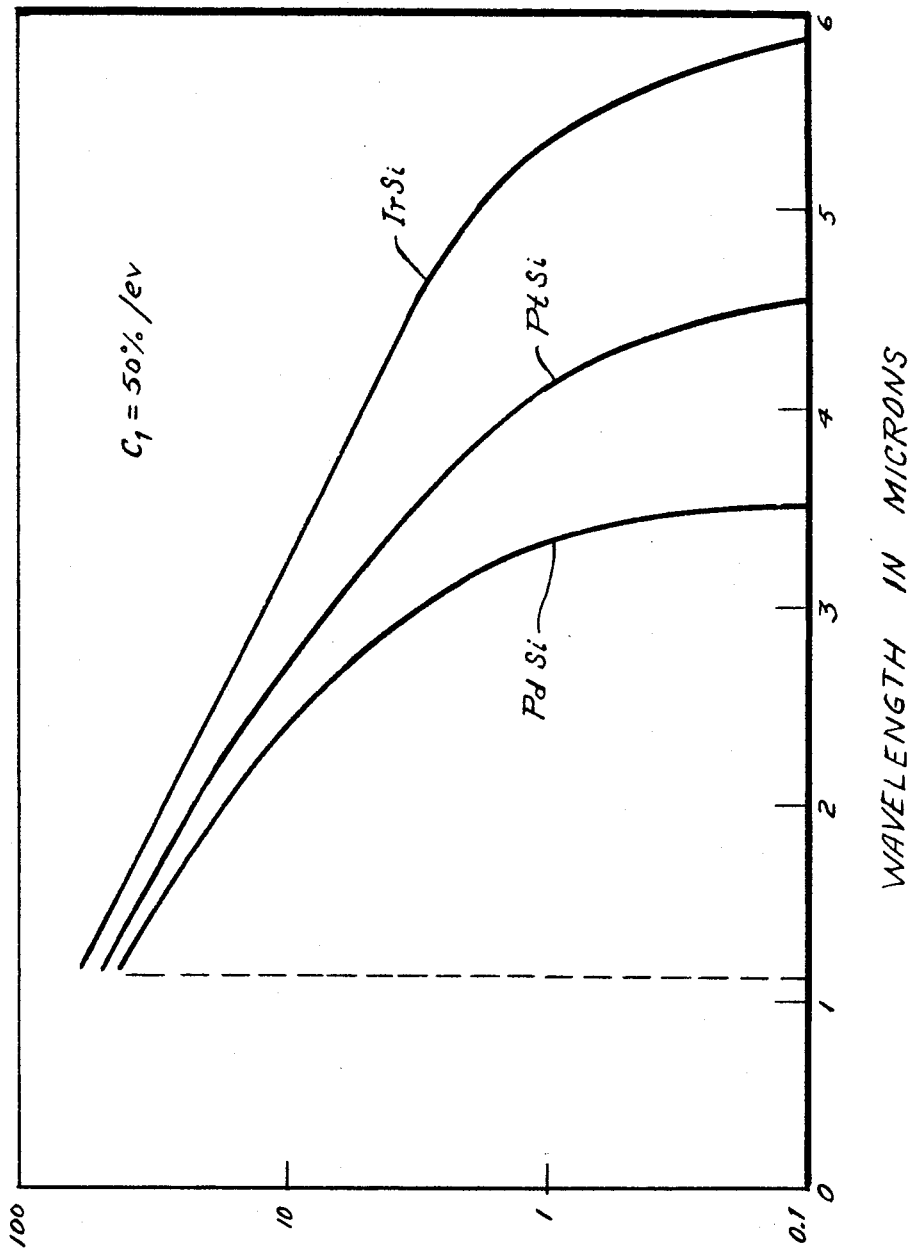
FIG. 4 is a graph which compares the frequency response of the Schottky barrier diode of the present invention with prior art silicon-based diodes of this type.

The aforementioned operation of the present invention over prior art devices are demonstrated graphically in FIG. 4 which is a plot of quantum efficiency in percent versus wavelength using the equation given above. This graph shows that IrSi-Si Schotkky barrier infrared detectors will cover the entire 3–5 micrometer band. Platinum silicide, which is the only type of Schottky barrier capable of operating at 3–5 micrometers, has a long wavelength cutoff of 4.7 micrometers which cuts off part of the band. A further improvement which comes from using the longer wavelength cutoff of IrSi is an increase in the photoelectric yield, Y. Assuming the same value of $C_1$ for both IrSi and PtSi, the IrSi is better by a factor of 5.6 at 3.4 micrometers and by a factor of 9.1 at 4.2 micrometers.

Although the invention has been described with reference to a particular embodiment, it will be understood to those skilled in the art that the invention is capable of a variety of alternative embodiments within the spirit and scope of the appended claims.

What is claimed is:

1. A Schottky barrier infrared photovoltaic detector wherein the operation of said detector in the infrared portion of the electromagnetic spectrum is by internal photoemission of holes over an electrical barrier, said detector comprising:
   a silicon substrate having a first and an opposed second surface;
   a layer of iridium silicide formed on said first surface of said substrate; and
   first and second contact means for making ohmic contact with said layer of iridium silicide and with said silicon substrate respectively;
   said silicon substrate comprising a wafer of p-type silicon material having an impurity concentration level not exceeding $10^{16}/cm^3$.

2. The Schottky barrier photovoltaic detector of claim 1 wherein said first and second contact means are each formed of aluminum.

3. The Schottky barrier photovoltaic detector of claim 2 and further comprising a guard ring implanted in said silicon substrate, said guard ring surrounding the periphery of said iridium silicide layer to block surface currents formed on said substrate and to eliminate edge effects.

4. The Schottky barrier photovoltaic detector of claim 3 wherein said guard ring is formed of n-type dopant material.

5. The Schottky barrier photovoltaic detector of claim 4 wherein said n-type dopant material is arsenic.

* * * * *